United States Patent [19]
Horie et al.

[11] Patent Number: 5,619,518
[45] Date of Patent: Apr. 8, 1997

[54] SEMICONDUCTOR LASER DIODE

[75] Inventors: Hideyoshi Horie; Yuichi Inoue; Kenji Shimoyama; Nobuyuki Hosoi; Goto Hideki, all of Ushiku, Japan

[73] Assignee: Mitsubishi Chemical Corporation, Tokyo, Japan

[21] Appl. No.: 363,261

[22] Filed: Dec. 23, 1994

[30] Foreign Application Priority Data

Dec. 27, 1993 [JP] Japan .................................. 5-333221

[51] Int. Cl.$^6$ ...................................................... H01S 3/19
[52] U.S. Cl. .................................................. 372/46; 372/45
[58] Field of Search ........................................ 372/45, 46

[56] References Cited

U.S. PATENT DOCUMENTS 5,289,486  2/1994  Iga et al. ................................... 372/45
5,355,384  10/1994  Inoue et al. ............................. 372/46

FOREIGN PATENT DOCUMENTS 637862  7/1994  European Pat. Off. .

OTHER PUBLICATIONS

U.S. Patent No. 4,706,254, Nov. 10, 1987, Nojiri et al.
U.S. Patent No. 5,213,995, May 25, 1993, Chen et al.
UK Patent Application GB 2 196789 A, May 5, 1988, Sharp Kabushiki Kaisha.
*Japanese Journal of Applied Physics*, vol. 30, No. 12B, Dec. 1991, pp. 3865–3872, "600 nm–Range GaInP/AlInP Multi–Quantum–Well (MQW) Lasers Grown on Misorientation Substrates by Gas Source Molecular Beam Epitaxy (GS–MBE)".
Patent Abstracts of Japan, JP58175887, Oct. 15, 1983, Kayane Naoki et al.
Patent Abstracts of Japan, JP60189983, Sep. 27, 1985, N. Kenichi.

*Primary Examiner*—James W. Davie
*Attorney, Agent, or Firm*—David G. Conlin; Brian L. Michaelis

[57] ABSTRACT

The disclosure described a semiconductor laser diode comprising at least a first clad layer, an active layer and a second clad layer disposed in this order on the substrate, and a buried layer for current blocking disposed at both sides in the cavity direction of the active layer, at least one of the first clad layer and second clad layer having at least one superlattice in the direction parallel with the substrate, and the average refractive index (nc1) of the first clad layer, the refractive index (na) of the active layer and the average refractive index (nc2) of the second clad layer satisfying the following equations.

$$na > nc1 \quad (1)$$

$$na > nc2 \quad (2)$$

21 Claims, 6 Drawing Sheets

FIG. 1
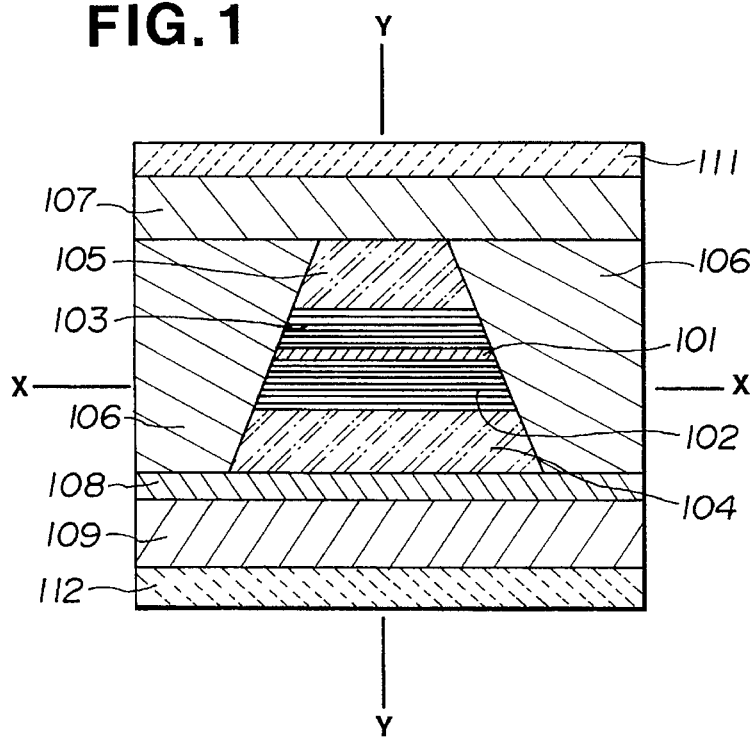
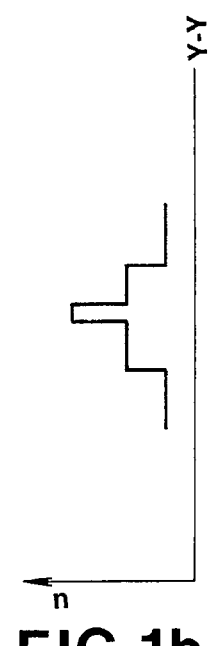
FIG.1b
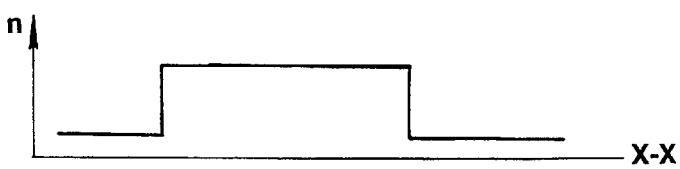
FIG.1a

SEMICONDUCTOR LASER DIODE

BACKGROUND OF THE INVENTION

The present invention relates to a semiconductor laser diode and, more specifically, the present invention relates to a semiconductor laser diode having excellent temperature characteristics.

Compound semiconductors have generally been utilized as materials for semiconductor laser diodes in recent years. Then, improvements have been conducted over and over for semiconductor laser diodes seeking for more stable lateral mode and higher temperature operation or the like.

In a basic structure of a laser diode, as shown in FIG. 5, a first clad layer 4, an active layer 2 and a second clad layer 5 are fabricated in this order on a substrate 9. As an example of a modification for the lateral structure of the basic laser diode, shown in FIG. 6, having a contact layer 7 capped at an upper portion, a structure having a current blocking layer (buried layer) 6 for improving the LD characteristics has been known. Further, as examples of modification for the vertical structure of the basic laser diode, there have been known a laser diode having a optical guide layer 2 (LOC structure) as shown in FIG. 7, a laser diode having a optical guide layer disposed on both sides (SCH structure) and a laser diode in which the composition of a optical guide layer is gradually varied in order to change the refractive index continuously (GRIN-SCH structure).

Further, the modification of the active layer itself in which the active layer is constituted as a quantum well structure such as a single quantum well (SQW) structure or a multi quantum well (MQW) structure have also be known.

These laser diodes have been obtained generally, for example, by a liquid phase epitaxy (LPE) method, a molecular beam epitaxy (MBE) method and a metallo-organic chemical vapor deposition (MOCVD) method, and the development, in particular, in the MBE method and the MOCVD method enables to produce a thin layer structure at an order of one monolayer.

Various proposals have been made for a structure vertical to the substrate in a laser diode as described above, but there are the following actual problems in the preparation of the layer structure thereof. Referring, for example, to MBE growth of an InGaAs system material on a GaAs substrate which has been expected as a light emitting material for a 980 nm region required for an exciting light source of an optical fiber amplifier in recent years, various structure in the laser diode using AlGaAs as a clad layer, GaAs as an optical guide layer and InGaAs as an active layer have been adopted for the vertical structure deposited onto the substrate. However, when a laser diode having this structure is produced, since an optimum growth temperature between AlGaAs and InGaAs has a temperature difference of about 200° to 250° C., there should has been conducted a method, for example, of performing the growth interruption and of lowering the temperature of the substrate after growth of the GaAs guide layer. However, by performing the growth interruption, since the crystal surface thereof is allowed to stand for a long time in preparation atmosphere, the contamination thereof is brought about, thereby causing deterioration of quality of the crystal. This is a fatal problem to the laser diode. In addition, in a structure in the laser diode using AlGaAs as a clad layer, AlGaAs having an Al concentration relatively lower than that of the clad layer as a guide layer and InGaAs as an active layer, during the growth interruption and lowering the temperature of the substrate after growth of the optical guide layer, the deposited material passes through a temperature region (for example, 600° to 630° C.) that an AlGaAs bulk crystal surface morphology in the optical guide layer does not show a mirror surface. Accordingly, it is theoretically expected that use of AlGaAs system for the optical guide layer can increase the quantum efficiency of spontaneous emission as compared with the case of using the GaAs system for the optical guide layer since carriers can be confined more effectively. However, since the deposited material passes through such a temperature region that the AlGaAs bulk crystal surface morphology does not show a mirror surface, there arises a phenomenon that the quantum efficiency of the obtained laser diode is lowered. As described above, also in the modification of the vertical structure proposed so far, it has been experienced that characteristics of the materials can not fully be displayed depending on the system.

Further, the temperature characteristics of the semiconductor laser diode depends not only on the materials described above but also greatly on the vertical layer structure. In most of semiconductor laser diodes having a buried structure, no higher temperature characteristics than that determined by physical properties thereof such as a band offset can be expected since both of the clad layer and the optical guide layer have a simple bulk structure, so that the characteristic temperature (To) is about 180K for the AlGaAs system and about 90K for the InGaAs system. It can not be said such characteristic temperature is satisfactory for the semiconductor laser diode which is used under conditions that becomes severe more and more.

Further, it is difficult by existent crystal growth techniques such as the LPE method or the MOCVD method to selectively bury and grow a layer having a refractive index relatively lower to each of deposited layers in order to increase the light confinement factor not only vertical but also in parallel with the layer. In particular, in the AlGaAs system semiconductor laser diodes, although a semiconductor layer having a refractive index relatively lower to the active layer can be formed as a buried layer, a semiconductor layer having a refractive index relatively lower than the clad layer can not be formed as a buried layer.

In view of the above, there has proposed as the modification of the LOC structure such a light-confining structure as shown in FIG. 8, in which the lateral current blocking layer 6 having lower refractive index relative to that of an active layer 1, a optical guide layer 2 and clad layers 4, 5 is fabricated (U.S. Pat. No. 5,355,383).

However, further higher performance has been demanded for the laser diode and a development for a semiconductor laser diode having better temperature characteristics has been demanded.

As a result of the present inventors' earnest studies, it has been found that by forming successively on the substrate at least a first clad layer, an active layer and a second clad layer, wherein at least one layer adjacent to the active layer, for example, at least one of the first clad layer and second clad layer has at least one superlattice in the direction parallel with the substrate, forming a buried layer for current blocking at both lateral sides of cavity direction of the active layer, and selecting the composition of the first clad layer and the second clad layer such that the (average) refractive index of the first clad layer and the second clad layer is less than a (average) refractive index of the active layer, the obtained semiconductor laser diode has more excellent temperature characteristics, is capable of satisfactory light confinement both in the vertical direction and the horizontal direction to the layer and is suitable to high temperature operation at low threshold current. The present invention has been attained based on the finding.

SUMMARY OF THE INVENTION

An object of the present invention is to provide a semiconductor laser diode having more excellent temperature characteristics and capable of confining light satisfactorily in both of vertical and horizontal directions relative to the layer.

Another object of the present invention to provide a semiconductor laser diode suitable to high power operation at low threshold current.

To accomplish the aims, in a first aspect of the present invention, there is provided a semiconductor laser diode comprising at least a first clad layer, an active layer and a second clad layer disposed in this order on the substrate, and a buried layer for current blocking formed at both sides in the cavity direction of the active layer, at least one of the first clad layer and second clad layer having at least one superlattice in the direction parallel with a substrate, and the (average) refractive index (nc1) of the first clad layer, the (average) refractive index (na) of the active layer and the (average) refractive index (nc2) of the second clad layer satisfying the following equations.

$$na>nc1 \qquad (1)$$

$$na>nc2 \qquad (2)$$

In a second aspect of the present invention, there is provided a semiconductor laser diode comprising at least a first clad layer having at least one superlattice in the direction parallel with a substrate, an active layer and a second clad layer disposed in this order on the substrate, and a buried layer for current blocking disposed at both sides in the cavity direction of the active layer, the average refractive index (nc1) of the first clad layer, the refractive index (na) of the active layer and the refractive index (nc2) of the second clad layer satisfying the following equations.

$$na>nc1 \qquad (1)$$

$$na>nc2 \qquad (2)$$

In a third aspect of the present invention, there is provided a semiconductor laser diode comprising at least a first clad layer, an optical guide layer and a second clad layer disposed in this order on the substrate, and a buried layer for current blocking formed at both sides in the cavity direction of the active layer, at least one of the optical guide layer and second clad layer having at least one superlattice in the direction parallel with a substrate, and the refractive index (nc1) of the first clad layer, the (average) refractive index (ng) of the optical guide layer, the refractive index (na) of the active layer and the (average) refractive index (nc2) of the second clad layer satisfying the following equations.

$$na>nc2 \qquad (2)$$

$$na>ng>nc1 \qquad (3)$$

In a fourth aspect of the present invention, there is provided a semiconductor laser diode comprising at least a first clad layer, an optical guide layer having at least one superlattice in the direction parallel with a substrate, and a second clad layer disposed in this order on the substrate, and a buried layer for current blocking formed at both sides in the cavity direction of the active layer, the refractive index (nc1) of the first clad layer, the average refractive index (ng) of the optical guide layer, the refractive index (na) of the active layer and the refractive index (nc2) of the second clad layer satisfying the following equations.

$$na>nc2 \qquad (2)$$

$$na>ng>nc1 \qquad (3)$$

In a fifth aspect of the present invention, there is provided a semiconductor laser diode comprising at least a first clad layer, a first optical guide layer, an active layer, a second optical guide layer and a second clad layer in this order on a substrate, and a buried layer for current blocking at both sides in the cavity direction of the active layer, at least one of the first optical guide layer and second optical guide layer having at least one superlattice in the direction parallel with a substrate, and the refractive index (nc1) of the first clad layer, the (average) refractive index (ng1) of the first optical guide layer, the refractive index (na) of the active layer, the (average) refractive index (ng2) of the second optical guide layer and the refractive index (nc2) of the second clad layer satisfying the following equations.

$$na>ng1>nc1 \qquad (4)$$

$$na>ng2>nc2 \qquad (5)$$

In a sixth aspect of the present invention, there is provided a semiconductor laser diode comprising at least a first clad layer, a first optical guide layer having at least one superlattice in the direction parallel with a substrate, an active layer, a second optical guide layer and a second clad layer in this order on a substrate, and a buried layer for current blocking at both sides in the cavity direction of the active layer, the refractive index (nc1) of the first clad layer, the average refractive index (ng1) of the first optical guide layer, the refractive index (na) of the active layer, the refractive index (ng2) of the second optical guide layer and the refractive index (nc2) of the second clad layer satisfying the following equations.

$$na>ng1>nc1 \qquad (4)$$

$$na>ng2>nc2 \qquad (5)$$

In a seventh aspect of the present invention, there is provided a semiconductor laser diode comprising at least a first clad layer, an active layer and a second clad layer disposed in this order on a substrate, and a buried layer for current blocking at both sides in the cavity direction of the active layer, the first clad layer having at least one superlattice in the direction parallel with the substrate at a portion of the first clad layer adjacent with the active layer, and the average refractive index (nc1) of the first clad layer, the refractive index (na) of the active layer and the refractive index (nc2) of the second clad layer satisfying the following equation.

$$na>nc1 \qquad (1)$$

na>nc2     (2)

In an eighth aspect of the present invention, there is provided a semiconductor laser diode comprising at least a first clad layer, an optical guide layer, an active layer and a second clad layer disposed in this order on a substrate, and a buried layer for current blocking at both sides in the cavity direction of the active layer, the optical guide layer having at least one superlattice in the direction parallel with the substrate at a portion of the optical guide layer adjacent with the active layer, and the refractive index (nc1) of the first clad layer, the average refractive index (ng) of the optical guide layer, the refractive index (na) of the active layer and the refractive index (nc2) of the second clad layer satisfying the following equations.

na>nc2     (2)

na>ng>nc1     (3)

In a ninth aspect of the present invention, there is provided a semiconductor laser diode comprising at least a first clad layer, a first optical guide layer, an active layer, a second optical guide layer and a second clad layer in this order on a substrate, and a buried layer for current blocking at both sides in the cavity direction of the active layer, the first optical guide layer having at least one superlattice in the direction parallel with the substrate at a portion of the first optical guide layer adjacent with the active layer, and the refractive index (nc1) of the first clad layer, the average refractive index (ng1) of the first optical guide layer, the refractive index (na) of the active layer, the refractive index (ng2) of the second optical guide layer and the refractive index (nc2) of the second clad layer satisfying the following equations.

na>ng1>nc1     (4)

na>ng2>nc2     (5)

In a tenth aspect of the present invention, there is provided a semiconductor laser diode comprising at least a first clad layer, an active layer and a second clad layer disposed in this order on a substrate, and a buried layer for current blocking at both sides in the cavity direction of the active layer, each of the first clad layer and the second clad layer having at least one superlattice in the direction parallel with the substrate at a portion of each of the first and second clad layers adjacent with the active layer, and the average refractive index (nc1) of the first clad layer, the refractive index (na) of the active layer and the average refractive index (nc2) of the second clad layer satisfying the following equations.

na>nc1     (1)

na>nc2     (2)

In an eleventh aspect of the present invention, there is provided a semiconductor laser diode comprising at least a first clad layer, an optical guide layer, an active layer and a second clad layer disposed in this order on a substrate, and a buried layer for current blocking at both sides in the cavity direction of the active layer, each of the optical guide layer and the second clad layer having at least one superlattice in the direction parallel with the substrate at a portion of each of the optical guide layer and the second clad layer adjacent with the active layer, and the refractive index (nc1) of the first clad layer, the average refractive index (ng) of the optical guide layer, the average refractive index (na) of the active layer and the average refractive index (nc2) of the second clad layer satisfying the following equations.

na>nc2     (2)

na>ng>nc1     (3)

In an twelfth aspect of the present invention, there is provided a semiconductor laser diode comprising at least a first clad layer, a first optical guide layer, an active layer, a second optical guide layer and a second clad layer in this order on a substrate, and a buried layer for current blocking at both sides in the cavity direction of the active layer, each of the first optical guide layer and the second optical guide layer having at least one superlattice in the direction parallel with the substrate at a portion of each of the first and second optical guide layers adjacent with the active layer, and the refractive index (nc1) of the first clad layer, the average refractive index (ng1) of the first optical guide layer, the refractive index (na) of the active layer, the average refractive index (ng2) of the second optical guide layer and the refractive index (nc2) of the second clad layer satisfying the following equations.

na>ng1>nc1     (4)

na>ng2>nc2     (5)

In a thirteenth aspect of the present invention, there is provided a semiconductor laser diode comprising at least a first clad layer, a first optical guide layer composed of the superlattice in the direction parallel with a substrate, an active layer, a second optical guide layer composed of the superlattice in the direction parallel with a substrate and a second clad layer in this order on a substrate, and a buried layer for current blocking at both sides in the cavity direction of the active layer, the refractive index (nc1) of the first clad layer, the average refractive index (ng1) of the first optical guide layer, the refractive index (na) of the active layer, the average refractive index (ng2) of the second optical guide layer and the refractive index (nc2) of the second clad layer satisfying the following equations.

na>ng1>nc1     (4)

na>ng2>nc2     (5)

BRIEF DESCRIPTION OF THE DRAWINGS

FIG. 1 is a schematic view illustrating a structure of a laser diode in Example 1 as an embodiment of the present invention;

FIGS. 1a and 1b show refractive index distribution of the laser diode of FIG. 1, taken along lines x—x and lines y—y, respectively;

DETAILED DESCRIPTION OF THE INVENTION

Figure 2:
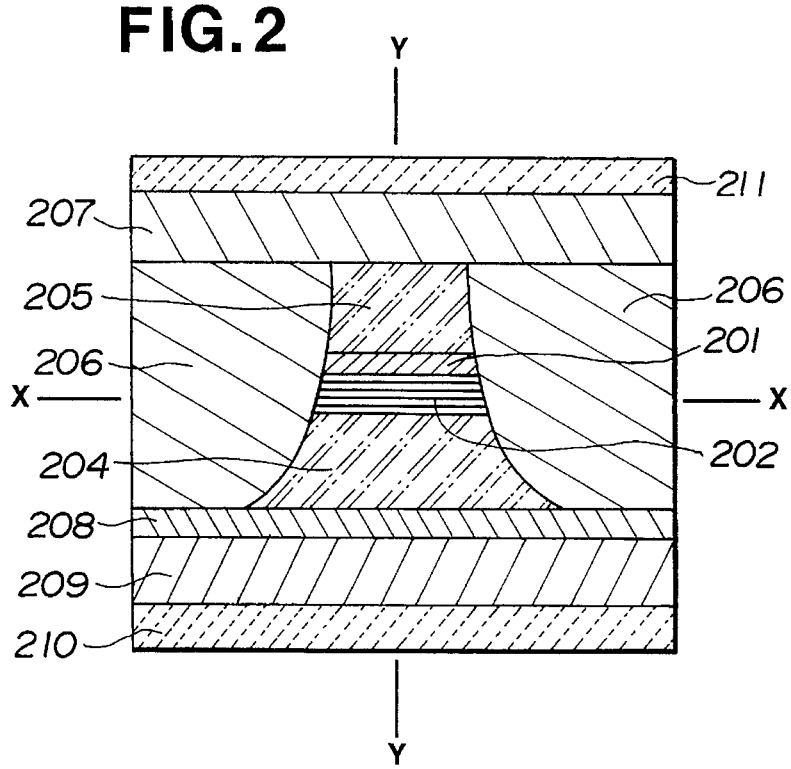
FIG. 2 is a schematic view illustrating structure of a laser diode in Example 2 as another embodiment of the present invention.

A substrate used in a semiconductor laser diode according to the present invention has no limitation in view of the kind of constituent elements or compounds, size of the substrate, or the like so long as the substrate comprises single crystals, and it preferably comprises a compound semiconductor.

A first clad layer may be disposed directly on the substrate and preferably, a layer of an identical composition with that of the substrate is formed on the substrate as a buffer layer. Since the single crystals used for the substrate usually have a number of defects and such defects reflect to the layer formed thereon and greatly lowers the performance as the semiconductor laser diode, the buffer layer is disposed in order to inhibit these disadvantages.

On the buffer layer, a first clad layer, an active layer and a second clad layer are deposited usually. If necessary, a optical guide layer may be disposed between the first clad layer and the active layer, or each of between the first clad layer and the active layer and between the active layer and the second clad layer.

Each of the first clad layer and the second clad layer is constituted with a material having a lower (average) refractive index than the refractive index of the active layer. For instance, if a GaAs system is used as the buffer layer, an AlGaAs system ($Al_xGa_{1-x}As$) is used for the first clad layer and the second clad layer, and the concentration thereof is properly selected such that the average refractive index can satisfy the foregoing requirements. Further, the concentration thereof may be identical or different with each other between the first clad layer and the second clad layer.

The active layer is composed of, for example, a GaAs system, an AlGaAs system, an InGaAs system and an InGaAsP system. As the structure for the layer, for example, various types of quantum well structures (SQW, MQW) comprising thin films of the material described above can be employed preferably.

By the use of the quantum well structure for the active layer, the threshold current lowers and the inner quantum efficiency is improved. In the present invention, in case where a superlattice is present adjacent with the active layer, since the quality of the crystal of the active layer is improved, the effects brought about by the quantum well structure grow larger.

Then, a optical guide layer can be used together with the active layer. For the disposition and modification of the optical guide layer, there can be exemplified, for example, a laser diode having a optical guide layer disposed on one side of the active layer (LOC structure), a laser diode having optical guide layers disposed on both sides of the active layer (SCH structure), and a laser diode varying the composition of the optical guide layer gradually, thereby changing the refractive index continuously (GRIN-SCH structure). The optical guide layer comprises, for example, a GaAs system, AlGaAs system and InGaP system.

By the formulation of at least one of superlattice, the quality of the crystal of the layer adjacent to the superlattice can be improved and the adjustment of the refractive index can be easy. As a result, the decrease of the threshold current and the improvement of the inner quantum efficiency can be realized. Further, the stability of the threshold current to the change of temperature can be attained.

The "superlattice" in the present invention is a structure in which at least two layers having respectively from one mono-layer to 200Å in thickness are deposited alternately, wherein the composition of the alternately deposited layers is different, or a structure in which a layer having one mono-layer to 200Å in thickness is sandwiched between two layers which have respectively more than 200Å in thickness and are different in material from the sandwiched layer.

In the present invention, the superlattice can be disposed any place in the layer(s) adjacent to the active layer, in the direction parallel with the substrate. Namely, the arrangement of the superlattice may be exemplified as follows.

The superlattice is disposed (1) in at least one of the first clad layer and second clad layer which are adjacent to the active layer, (2) in at least one of the optical guide layer and second clad layer which are adjacent to the active layer, or (3) in at least one of the first optical guide layer and second optical guide layer which are adjacent to the active layer.

The following arrangements thereof are preferable.

The superlattice is disposed at (1) the contacting surface of at least one of the first clad layer and second clad layer to the active layer, which is adjacent with the active layer, (2) the contacting surface of at least one of the optical guide layer and second clad layer to the active layer, which is adjacent with the active layer, or (3) the contacting surface of at least one of the first optical guide layer and second optical guide layer to the active layer, which is adjacent with the active layer.

It is more preferred that the whole of optical guide layer(s) is made of superlattice.

Also, in case where the superlattice is constituted by a GaAs layer and an AlGaAs layer, since the refractive index can be optionally set up by adjusting the thickness of the AlGaAs layer to that of the GaAs layer, it may be applicable to a CHARP structure.

The buried layer disposed on both sides in the cavity direction of active layer for current blocking comprises AlGaAs system, GaAs system, InGaP system or InGaAsP system.

The thickness for each of the layers in the semiconductor laser diode according to the present invention is from 0.1 to 1 μm for the buffer layer; from 0.5 to 3.5 μm for the first clad layer; from 200 Å to 1 μm for the active layer; from 0.5 to 3.5 μm for the second clad layer. The thickness of the first optical guide layer is from 100 to 1,000 Å and the thickness of the second optical guide layer is from 100 to 1,000 Å. In case of adopting the quantum well structure, the thickness of the well layer is 20 to 200 Å. Also, in case of multi quantum well (MQW) structure, the thickness of the quantum well layer is 20 to 200 Å and the thickness of the spacer separating the quantum well layers is 20 to 200Å. Therefore, in case of the MQW structure, according to the above definition, the active layer has superlattice. However, the superlattice in the active layer arises inevitably from the suitable thickness thereof by adaopting the MQW structure.

In accordance with another feature of the present invention, the refractive index of the active layer is maximum, the refractive index of the layer(s) apart from the active layer become low, successively, and the refractive index of the buried layer is minimum.

The "average refractive index" of the present invention means a refractive index of the layer having the superlattice, and specifically, a value obtained by averaging a refractive index of a material constituting the layer having the superlattice in bulk to the thickness ratio of the layer composed of such material in the laser diode.

For example, the refractive index (at 980 nm) of GaAs in bulk is 3.53; the refractive index of $Al_xGa_{1-x}As$ (x=0.27) in bulk is 3.38, the refractive index of $Al_xGa_{1-x}As$ (x=0.3) in bulk is 3.36, the refractive index of $Al_xGa_{1-x}As$ (x=0.4) in bulk is 3.31, the refractive index of $Al_xGa_{1-x}As$ (x=0.45) in bulk is 3.28, the refractive index of $Al_xGa_{1-x}As$ (x=0.48) in bulk is 3.26, the refractive index of $Al_xGa_{1-x}As$ (x=0.6) in bulk is 3.20 and the refractive index of $Al_xGa_{1-x}As$ (x=0.9) in bulk is 3.02; the refractive index of $In_{0.5}Ga_{0.5}P$ in bulk is 3.26; and the refractive index of $In_{0.2}Ga_{0.8}As$ in bulk is 3.55.

A dopant hardly destroying the superlattice is preferably used for the superlattice. Specifically, in a case where the superlattice comprises a III–V group compound, carbon, magnesium and beryllium are preferred as the p-type dopant, while silicon is preferred as the n-type dopant.

Various kinds of ordinary methods may be used for preparing the laser diode according to the present invention and the MOCVD method or the MBE method is superior to LPE method since the thin film can be produced in high precision. Particularly, since MBE method is excellent in film thickness control it is suited to prepare the superlattice. Also, since the MOCVD method is able to carried out the selective growth, it is suited to prepare the buried layer.

Description will be made to a typical example for the method of preparing a laser diode according to the present invention is explained as follows, referring a most simple laser diode described in the first aspect.

At first, after the growth of a first clad layer by the MBE method on a substrate by an ordinary method, a superlattice as a portion of the first clad layer is deposited on the first clad layer. Further, the active layer and the second clad layer are deposited thereon. It is necessary in this case to satisfy the following equations (1) and (2):

$$na > nc1 \quad (1)$$

$$na > nc2 \quad (2)$$

(wherein nc1 represents the (average) refractive index of the first clad layer, na represents the (average) refractive index of the active layer, and nc2 represents the (average) refractive index of the second clad layer).

Subsequently, a ridge is formed by applying masking by photolithography to the thus formed DH structure and then applying etching to a desired depth. It must be a depth reaching the first clad layer. For carrying out etching at a high accuracy, the composition is varied greatly or the material constituting the superlattice is changed in each of the layers constituting the superlattice grown in the first clad layer. Since the etching rate is greatly reduced at the instance reaching this layer, it acts as an etching stop layer to preferably stabilize the laser diode structure.

A layer having a higher electric resistance as compared with the ridged portion is buried in the thus obtained buried layer portion. Since it is preferred that the layer functions as the light confining layer in the lateral direction, it is preferred to make the refractive index of the layer lower as compared with any other layer. For this purpose, layer, for example, with a large aluminum concentration is used in case of a III–V group compound. Further, when the layer of high aluminum compositional ratio is buried, in case where of hydrogen halide such as hydrogen chloride or halogen itself is flowed together with the raw material gas is preferred since the deposition of polycrystals on the mask is suppressed.

In accordance with the present invention, this most simple structure is used as a base in which the optical guide layer may be disposed or the superlattice may be disposed so as to be adjacent with on both sides of the active layer. It is preferred in this case that the refractive index for each of the layers adjacent with on both sides of the active layer is lower to that of the active layer in order to confine light. Specifically, it is preferred to satisfy the following equations (4) and (5):

$$na > ng1 > nc1 \quad (4)$$

$$na > ng2 > nc2 \quad (5)$$

(wherein nc1 represents the refractive indexes of the first clad layer, ng1 represents the average refractive indexes of the first optical guide layer, na represents the (average) refractive indexes of the active layer, ng2 represents the average refractive indexes of the second optical guide layer and nc2 represents the refractive index of the second clad layer).

In accordance with the present invention, it is more preferred to satisfy the following equations (6) and (7) for confining light in the lateral direction:

$$nc1 > nx \quad (6)$$

$$nc2 > nx \quad (7)$$

(wherein nc1 represents the (average) refractive index of the first clad layer, nc2 represents the (average) refractive index of the second clad layer, and nx represents the refractive index of the buried layer).

With the structure described above, light is confined also in the lateral direction of the active layer to obtain a high optical confinement efficiency and a low loss.

The semiconductor laser diode according to the present invention has a characteristic temperature of not less than 150K and can be used effectively even under severe conditions. Further, the semiconductor laser diode stable to the variation of the temperature can be provided. Also, according to the present invention, the difference of the refractive index of between the active layer and clad layer can enlarge.

In accordance with the present invention, since the temperature characteristics of the semiconductor laser diode can be improved due to the effect of the superlattice introducing thereinto in direction parallel with the substrate and the quality of the crystal the active layer can be improved by the introduction of the superlattice into portion where is adjacent to the active layer, the characteristics can be improved such as lowering of the threshold current density (jth) for the entire semiconductor laser diode and improvement of the inner quantum efficiency (ηi). Further, by using Si as the n-type dopant and one of C, Mg and Be as the p-type dopant for the dopants to be introduced, the above-mentioned structure can be attained at good reproducibility without losing the order of the superlattice formed in the laser diode.

Further, in accordance with the present invention, light can be confined efficiently also in the direction parallel with the layer, loss of the resonator is reduced and the inner quantum efficiency is improved. As a result, a laser diode having the stabile threshold current at high temperature can be realized.

Further, since the distribution of light in the direction vertical to each of the layers and distribution of light in the direction parallel with the layer of the laser diode can be easily designed, the shape of the laser beam can be controlled easily and a laser diode having an aspect ratio of about 1 in case of not only the near field pattern but also the far field pattern can be provided.

Further, when the length of the cavity and the width of the stripe are designed properly, a laser in which the oscillating by a longitudinal mode in a multi-spectrum even at a high power of not less than 30 mW and with less variation of noise level relative to the returning light can be manufactured.

EXAMPLE

The present invention will now be explained with reference to examples, but the invention is not restricted only to such examples unless it does not go beyond the scope thereof.

EXAMPLE 1

FIG. 1 shows a structure of a semiconductor laser diode in this Example according to the present invention. On a (100) n-GaAs substrate 109 (Si=1×10$^{18}$ cm$^{-3}$), are formed continuously by molecular beam epitaxy (MBE) method, n-GaAs buffer layer 108 (Si=1×10$^{18}$ cm$^{-3}$, 0.7 μm), n-Al$_{0.6}$Ga$_{0.4}$As clad layer 104 (Si=5×10$^{17}$ cm$^{-3}$, 2 μm, nc1=3.20), undoped Al$_{0.45}$Ga$_{0.55}$As/GaAs superlattice optical guide layer 102 [thickness: 1000 Å, 40 units of Al$_{0.45}$Ga$_{0.55}$As(15 Å)/GaAs(10 Å), ng1=3.38], undoped In$_{0.2}$Ga$_{0.8}$As active layer 101 (60Å, na=3.55), undoped Al$_{0.45}$Ga$_{0.55}$As/GaAs superlattice optical guide layer 102 [thickness: 1000 Å, 40 units of Al$_{0.45}$Ga$_{0.55}$As(15 Å)/GaAs(10 Å), ng2=3.38] and p-Al$_{0.6}$Ga$_{0.4}$As clad layer 105 (Be=5×10$^{17}$ cm$^{-3}$, 2 μm, nc2=3.20). In this instance, since a large difference for the optimum growth temperature is present between the clad layer and the active layer, the growing temperature is changed during deposition of the superlattice guide layer without growth interruption. Then, 1000 Å SiN film is deposited on the clad layer 105 by p-CVD method and then fabricated into a stripe of 3 μm width using photolithography. Then, the gas-etching was carried out in a MOCVD chamber to form a ridged shape while introducing hydrogen chloride gas at 1 sccm into the MOCVD chamber, thereby fabricating the clad layer 104, the superlattice optical guide layer 102, the active layer 101, the superlattice optical guide layer 103 and the clad layer 105 into the ridged shape. Successively, undoped Al$_{0.9}$Ga$_{0.1}$As buried layer 106 is grown by the MOCVD method while introducing a hydrogen chloride gas. Then, the SiN film is removed by plasma etching. Finally, p-GaAs cap layer 107 (C=1×10$^{19}$ cm$^{-3}$, 1 μm) is grown by the MOCVD method. A semiconductor portion of the laser diode is constituted as described above.

Further, AuZn/Au 111 (p-side electrode) is formed on the p-GaAs cap layer 107, while AuGe/Ni/Au 110 (n-side electrode) is deposited on the n-GaAs semiconductor substrate 109 each by evaporation, applied with alloy-treatment to form electrodes, thereby obtaining a laser diode. FIG. 1a and FIG. 1b show the analysis for refractive indexes in the horizontal direction (along line X—X) and the vertical direction (along line Y—Y). The characteristic temperature (To) of the laser diode was 280K.

EXAMPLE 2

FIG. 2 shows a structure of a semiconductor laser diode in this Example according to the present invention. On (100) n-GaAs semiconductor substrate 209 (Si=1×10$^{18}$ cm$^{-3}$), are formed continuously by the MOCVD method, n-GaAs buffer layer 208 (Si=1×10$^{18}$ cm$^3$, 0.6 μm), n-Al$_{0.6}$Ga$_{0.4}$As clad layer 204 (Si=3×10$^{17}$ cm$^{-3}$, 1.5 μm, nc1=3.20), undoped Al$_{0.45}$Ga$_{0.55}$As/GaAs superlattice optical guide layer 202 [thickness: 1500 Å, 60 units of Al$_{0.45}$Ga$_{0.55}$As (15 Å)/GaAs (10 Å), ng1=3.38], undoped GaAs active layer 201 (300 Å, na=3.53), p-Al$_{0.6}$Ga$_{0.4}$As clad layer 205 (C=5×10$^{17}$ cm$^{-3}$, 1.5 μm, nc2=3.20). Then, 1000 Å SiN film is deposited on the clad layer 205 by p-CVD method, which is then fabricated into a stripe of 4.5 μm width by photolithography. Then, wet etching is applied with a tartaric acid system etchant using SiN as a mask to fabricate the clad layer 204, the superlattice optical guide layer 202, the active layer 201 and the clad layer 205 into a ridged shape. Successively, an undoped Al$_{0.8}$Ga$_{0.2}$As buried layer 206 is grown by organic metal vapor phase MOCVD method while introducing a hydrogen chloride gas at 1 sccm. Then, the SiN film is removed by plasma etching. Finally, p-GaAs cap layer 207 (C=1×10$^{19}$ cm$^{-3}$, 1 μm) is caused to grow by the MOCVD method. A semiconductor portion of the laser diode is thus constituted.

Figure 2B:
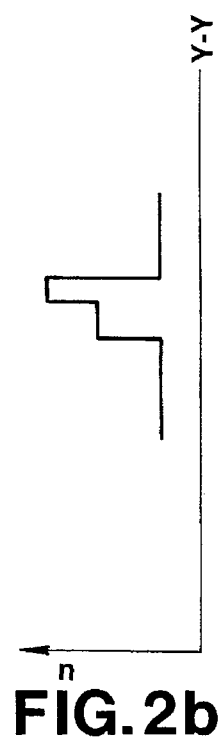
FIGS. 2a and 2b shown refractive index distribution of the laser diode of FIG. 2 taken along lines x—x and lines y—y, respectively.
Figure 2A:
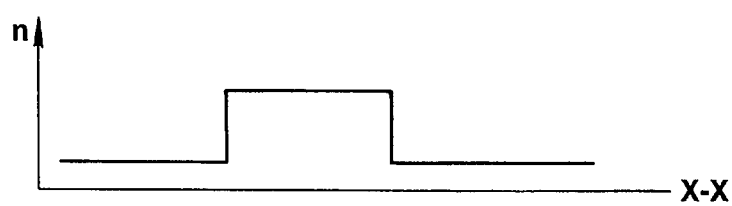

Further, Ti/Pt/Au 211 (p-side electrode) is formed on the p-GaAs cap layer 207 while Ti/Pt/Au 210 (n-side electrode) is formed on the n-GaAs semiconductor substrate 209 (n-side electrode) by the electron beam evaporation method and applied with heat-treatment, thereby obtaining a laser diode. In FIG. 2a and FIG. 2b, the refractive index distribution in the horizontal direction (along line X—X) and the refractive index distribution in the vertical direction (along line Y—Y) are also shown.

The characteristic temperature (To) of the laser diode was 260K and a relation between the temperature and the threshold current is substantially equivalent with that in Example 1.

Figure 3:
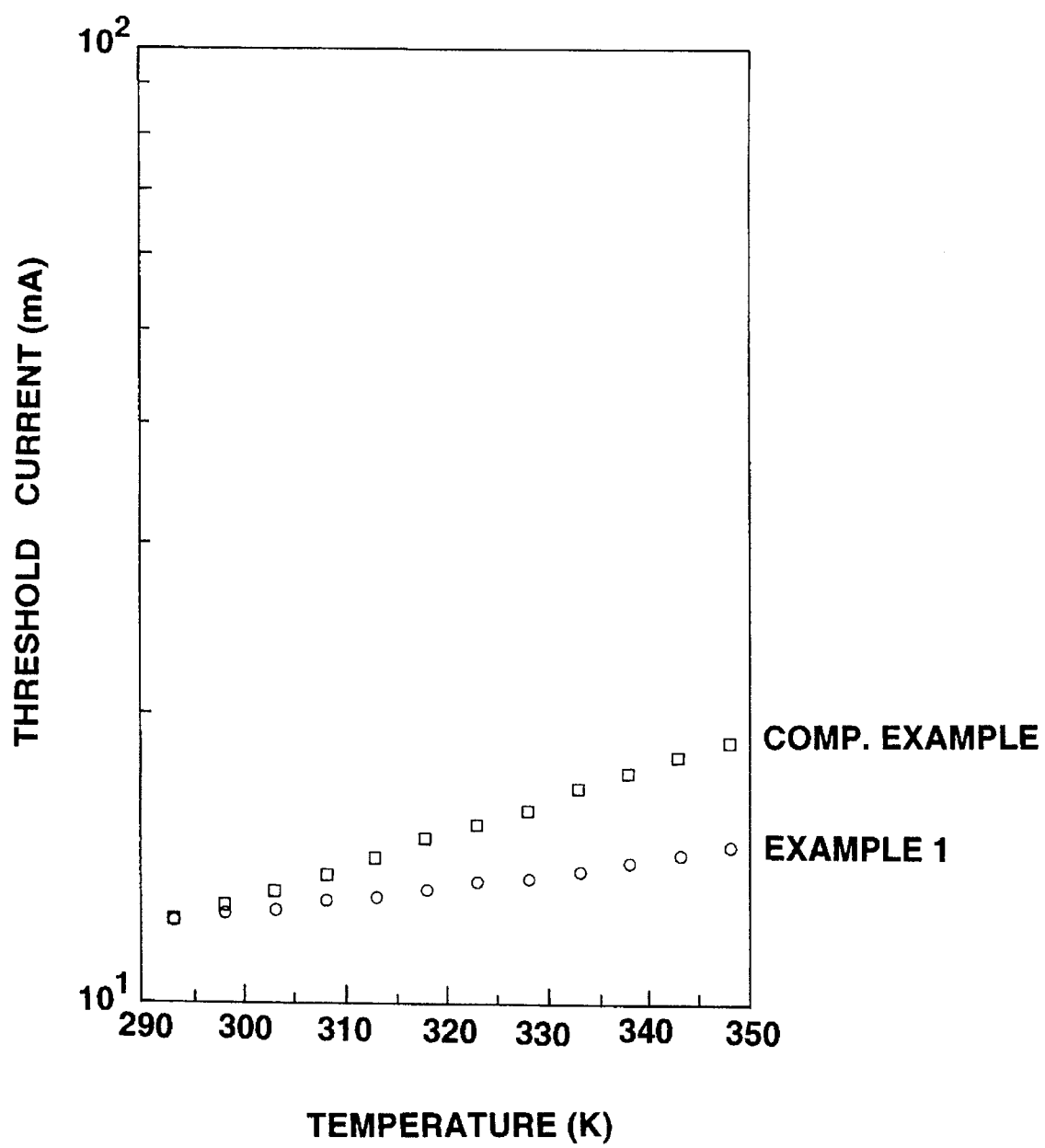
FIG. 3 is a view illustrating the change of threshold current depending on temperature.

FIG. 3 shows a relationship between the temperature and the threshold current on the semiconductor laser diode in Example 1 of this embodiment.

COMPARATIVE EXAMPLE

Figure 4:
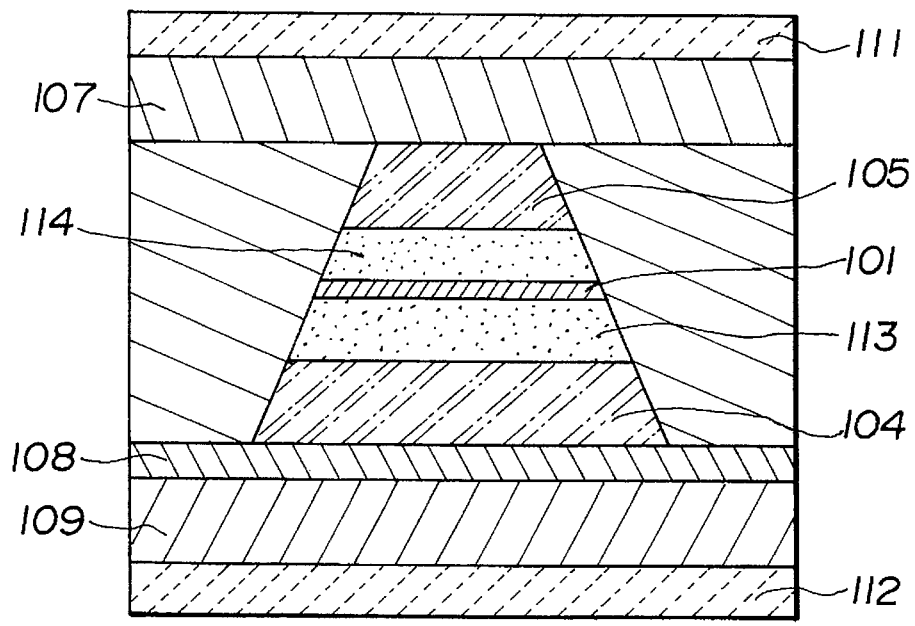
FIG. 4 is a schematic view illustrating a laser diode having no superlattice in a comparative example.
Figure 5:
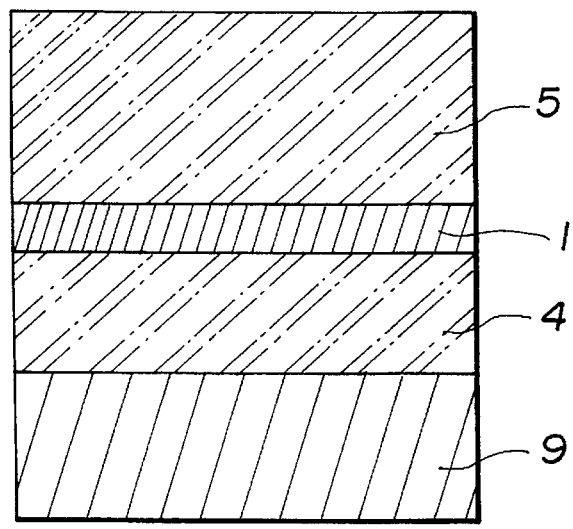
FIG. 5 is a schematic view illustrating an example of a most simple conventional laser diode structure.
Figure 6:
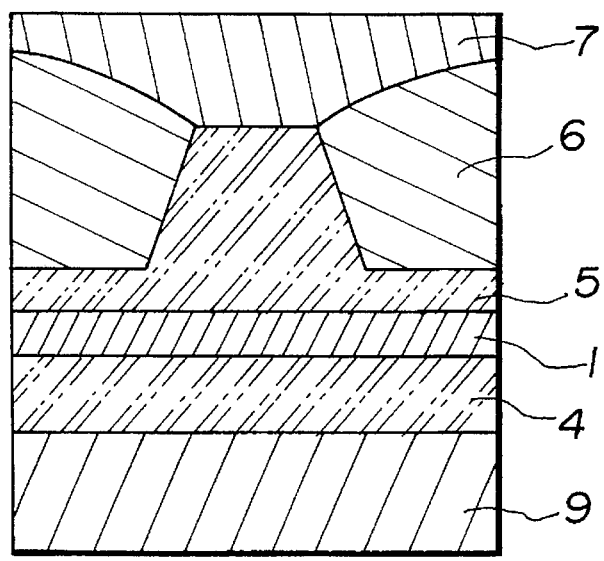
FIG. 6 is a schematic view illustrating an example of a conventional laser diode structure having a current blocking layer.
Figure 7:
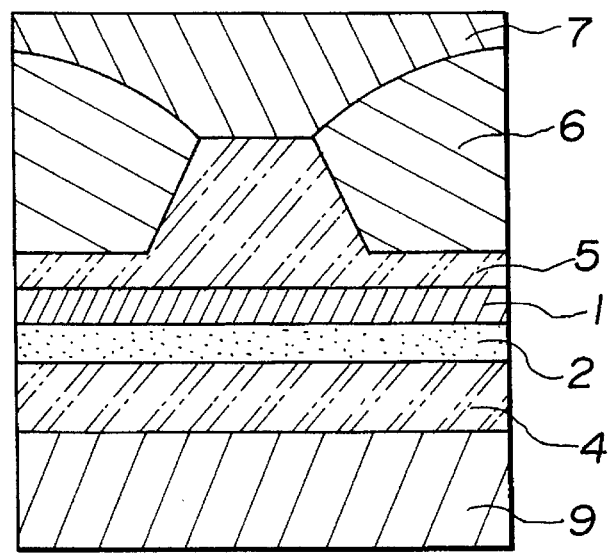
FIG. 7 is a schematic view illustrating an example of a conventional laser diode structure having a optical guide layer.
Figure 8:
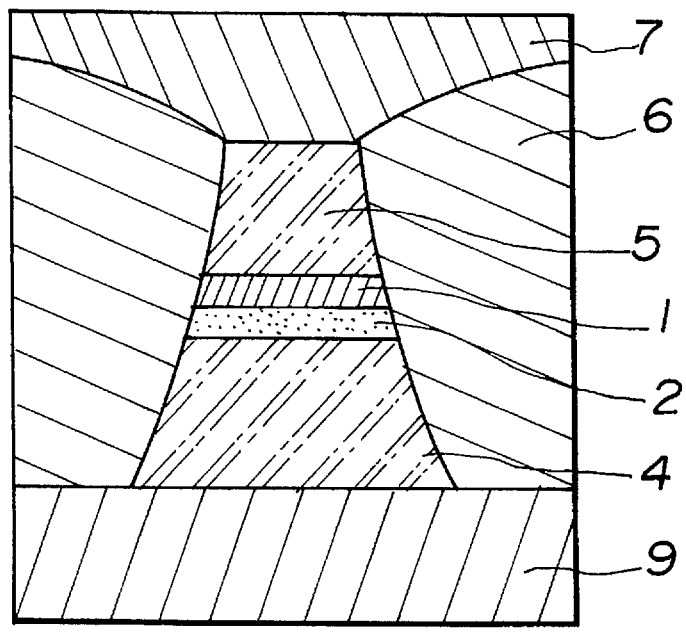
FIG. 8 is a schematic view illustrating an example of a previously proposed laser diode.

A laser diode of a structure shown in FIG. 4 was manufactured by growing in the same manner as in Example 1 except for merely forming optical guide layers 113 and 114 on both sides of the active layer of Al$_{0.27}$Ga$_{0.73}$As at 1000 Å thickness. The characteristic temperature (To) of the laser diode was 120K. Further, the temperature and the threshold current were measured. The results are shown in FIG. 3.

What is claimed is:

1. A semiconductor laser diode comprising at least a first clad layer, an active layer and a second clad layer disposed in this order on a substrate, and a buried layer for current blocking disposed at both sides in the cavity direction of the active layer, at least one of the first clad layer and second clad layer having at least one superlattice in the direction parallel with the substrate, and the average refractive index (nc1) of the first clad layer, the refractive index (na) of the active layer and the average refractive index (nc2) of the second clad layer satisfying the following equations $$na > nc1 \quad (1)$$

$$na > nc2 \quad (2).$$

2. A semiconductor laser diode according to claim 1, wherein the first clad layer has at least one superlattice in the direction parallel with the substrate.

3. A semiconductor laser diode according to claim 1, wherein the superlattice in the first clad layer is adjacent with the active layer.

4. A semiconductor laser diode according to claim 1, wherein the second clad layer has at least one superlattice in the direction parallel with the substrate.

5. A semiconductor laser diode according to claim 3, wherein the active layer is composed of an InGaAs system and the first clad layer is composed of an AlGaAs system.

6. A semiconductor laser diode comprising at least a first clad layer, a first optical guide layer, an active layer and a second clad layer disposed in this order on a substrate, and
a buried layer for current blocking disposed at both sides in the cavity direction of the active layer,
at least one of the first optical guide layer and second clad layer having at least one superlattice in the direction parallel with the substrate, and the refractive index ($nc_1$) of the first clad layer, the average refractive index (ng) of the first optical guide layer, the refractive index (na) of the active layer and the average refractive index (nc2) of the second clad layer satisfying the following equations $$na > nc2 \quad (2)$$

$$na > ng > nc1 \quad (3).$$

7. A semiconductor laser diode according to claim 6, wherein the first optical guide layer has at least one superlattice in the direction parallel with the substrate.

8. A semiconductor laser diode according to claim 6, wherein a second optical guide layer is disposed between the active layer and the second clad layer,
at least one of the first optical guide layer and second optical guide layer having at least one superlattice in the direction parallel with the substrate, and the refractive index (nc1) of the first clad layer, the average refractive index (ng1) of the first optical guide layer, the refractive index (na) of the active layer, the average refractive index (ng2) of the second optical guide layer and the refractive index (nc2) of the second clad layer satisfy the following equations $$na > ng1 > nc1 \quad (4)$$

$$na > ng2 > nc2 \quad (5).$$

9. A semiconductor laser diode according to claim 8, wherein the first optical guide layer has at least one superlattice in the direction parallel with a substrate.

10. A semiconductor laser diode according to claim 7 or 9, wherein the superlattice in the first optical guide layer is adjacent with the active layer.

11. A semiconductor laser diode according to claim 6, wherein the second clad layer has at least one superlattice in the direction parallel with the substrate.

12. A semiconductor laser diode according to claim 8, wherein the second optical guide layer has at least one superlattice in the direction parallel with the substrate.

13. A semiconductor laser diode according to claim 4 or 11, wherein the superlattice in the second clad layer is adjacent with the active layer.

14. A semiconductor laser diode according to claim 12, wherein the superlattice in the second optical guide layer is adjacent with the active layer.

15. A semiconductor laser diode according to claim 2 or 7, wherein the second clad layer has at least one superlattice in the direction parallel with the substrate.

16. A semiconductor laser diode according to claim 9, wherein the second optical guide layer has at least one superlattice in the direction parallel with the substrate.

17. A semiconductor laser diode according to claim 9, wherein the composition of the first optical guide layer, the second optical guide layer or the first and the second guide layers is changed continuously, intermittently or continuously and intermittently to form a light confining structure.

18. A semiconductor laser diode according to claim 1, 6 or 8, wherein the refractive index of the buried layer (nx), the average refractive index of the first clad layer (nc1) and the average refractive index of the second clad layer (nc2) satisfy the following equations $$nc1 > nx \quad (6)$$

$$nc2 > nx \quad (7).$$

19. A semiconductor laser diode according to claim 1, 6 or 8, wherein the active layer comprises a quantum well structure.

20. A semiconductor laser diode according to claim 7, 9, 12 or 16, wherein the optical guide layer comprises a superlattice.

21. A semiconductor laser diode according to claim 10, wherein the active layer is composed of an InGaAs system and the first optical guide layer is composed of an AlGaAs system.

* * * * *